United States Patent
Radosavljevic et al.

(10) Patent No.: US 7,915,167 B2
(45) Date of Patent: *Mar. 29, 2011

(54) FABRICATION OF CHANNEL WRAPAROUND GATE STRUCTURE FOR FIELD-EFFECT TRANSISTOR

(75) Inventors: Marko Radosavljevic, Beaverton, OR (US); Amlan Majumdar, Portland, OR (US); Suman Datta, Beaverton, OR (US); Jack Kavalieros, Portland, OR (US); Brian S. Doyle, Portland, OR (US); Justin K. Brask, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 1515 days.

This patent is subject to a terminal disclaimer.

(21) Appl. No.: 11/240,440

(22) Filed: Sep. 29, 2005

(65) Prior Publication Data
US 2006/0068591 A1    Mar. 30, 2006

(51) Int. Cl.
*H01L 21/302* (2006.01)
(52) U.S. Cl. .......................... 438/689; 438/719
(58) Field of Classification Search .......... None
See application file for complete search history.

(56) References Cited

U.S. PATENT DOCUMENTS

| | | |
|---|---|---|
| 4,487,652 A | 12/1984 | Almgren |
| 4,818,715 A | 4/1989 | Chao |
| 4,906,589 A | 3/1990 | Chao |
| 4,907,048 A | 3/1990 | Huang |
| 4,994,873 A | 2/1991 | Madan |
| 4,996,574 A | 2/1991 | Shirasaki |
| 5,124,777 A | 6/1992 | Lee |
| 5,179,037 A | 1/1993 | Seabaugh |
| 5,216,271 A | 6/1993 | Takagi et al. |
| 5,308,999 A | 5/1994 | Gotou |
| 5,338,959 A | 8/1994 | Kim et al. |
| 5,346,839 A | 9/1994 | Sundaresan |
| 5,391,506 A | 2/1995 | Tada et al. |
| 5,466,621 A | 11/1995 | Hisamoto et al. |
| 5,482,877 A | 1/1996 | Rhee |
| 5,514,885 A | 5/1996 | Myrick |

(Continued)

FOREIGN PATENT DOCUMENTS

DE    102 03 9978 A1    8/2003

(Continued)

OTHER PUBLICATIONS

Sung Min Kim, et al., A Novel Multi-channel Field Effect Transistor (McFET) on Bulk Si for High Performance Sub-80nm Application, IEDM 04-639, 2004 IEEE, pp. 27.4.1-27.4.4.

(Continued)

*Primary Examiner* — Shamim Ahmed
(74) *Attorney, Agent, or Firm* — Blakely, Sokoloff, Taylor & Zafman LLP

(57) ABSTRACT

A method for fabricating a field-effect transistor with a gate completely wrapping around a channel region is described. Ion implantation is used to make the oxide beneath the channel region of the transistor more etchable, thereby allowing the oxide to be removed below the channel region. Atomic layer deposition is used to form a gate dielectric and a metal gate entirely around the channel region once the oxide is removed below the channel region.

20 Claims, 5 Drawing Sheets

U.S. PATENT DOCUMENTS

| | | | |
|---|---|---|---|
| 5,521,859 A | 5/1996 | Ema et al. |
| 5,543,351 A | 8/1996 | Hirai et al. |
| 5,545,586 A | 8/1996 | Koh |
| 5,563,077 A | 10/1996 | Ha et al. |
| 5,578,513 A | 11/1996 | Maegawa |
| 5,658,806 A | 8/1997 | Lin et al. |
| 5,682,048 A | 10/1997 | Shinohara et al. |
| 5,698,869 A | 12/1997 | Yoshimi et al. |
| 5,701,016 A | 12/1997 | Burroughes et al. |
| 5,716,879 A | 2/1998 | Choi et al. |
| 5,739,544 A | 4/1998 | Yuki et al. |
| 5,770,513 A | 6/1998 | Okaniwa |
| 5,804,848 A | 9/1998 | Mukai |
| 5,811,324 A | 9/1998 | Yang |
| 5,814,895 A | 9/1998 | Hirayama |
| 5,821,629 A | 10/1998 | Wen et al. |
| 5,827,769 A | 10/1998 | Aminzadeh et al. |
| 5,844,278 A | 12/1998 | Mizuno et al. |
| 5,880,015 A | 3/1999 | Hata |
| 5,888,309 A | 3/1999 | Yu |
| 5,889,304 A | 3/1999 | Watanabe et al. |
| 5,899,710 A | 5/1999 | Mukai |
| 5,905,285 A | 5/1999 | Gardner et al. |
| 5,908,313 A | 6/1999 | Chau et al. |
| 5,952,701 A | 9/1999 | Bulucea et al. |
| 5,965,914 A | 10/1999 | Miyamoto |
| 5,976,767 A | 11/1999 | Li |
| 6,013,926 A | 1/2000 | Oku et al. |
| 6,018,176 A | 1/2000 | Lim |
| 6,054,355 A | 4/2000 | Inumiya et al. |
| 6,066,869 A | 5/2000 | Noble et al. |
| 6,087,208 A | 7/2000 | Krivokapic et al. |
| 6,093,621 A | 7/2000 | Tseng |
| 6,117,741 A | 9/2000 | Chatterjee et al. |
| 6,120,846 A | 9/2000 | Hintermaier et al. |
| 6,153,485 A | 11/2000 | Pey et al. |
| 6,163,053 A | 12/2000 | Kawashima |
| 6,165,880 A | 12/2000 | Yaung et al. |
| 6,174,820 B1 | 1/2001 | Habermehl et al. |
| 6,218,309 B1 | 4/2001 | Miller et al. |
| 6,251,729 B1 | 6/2001 | Montree et al. |
| 6,251,763 B1 | 6/2001 | Inumiya et al. |
| 6,252,284 B1 | 6/2001 | Muller et al. |
| 6,261,921 B1 | 7/2001 | Yen et al. |
| 6,294,416 B1 | 9/2001 | Wu |
| 6,317,444 B1 | 11/2001 | Chakrabarti |
| 6,335,251 B2 | 1/2002 | Miyano et al. |
| 6,359,311 B1 | 3/2002 | Colinge et al. |
| 6,376,317 B1 | 4/2002 | Forbes et al. |
| 6,391,782 B1 | 5/2002 | Yu |
| 6,396,108 B1 | 5/2002 | Krivokapic et al. |
| 6,403,981 B1 | 6/2002 | Yu |
| 6,407,442 B2 | 6/2002 | Inoue et al. |
| 6,413,802 B1 | 7/2002 | Hu et al. |
| 6,413,877 B1 | 7/2002 | Annapragada |
| 6,424,015 B1 | 7/2002 | Ishibashi et al. |
| 6,437,550 B2 | 8/2002 | Andoh et al. |
| 6,459,123 B1 | 10/2002 | Enders et al. |
| 6,472,258 B1 | 10/2002 | Adkisson et al. |
| 6,475,869 B1 | 11/2002 | Yu |
| 6,475,890 B1 | 11/2002 | Yu |
| 6,483,156 B1 | 11/2002 | Adkisson et al. |
| 6,495,403 B1 | 12/2002 | Skotnicki et al. |
| 6,498,096 B2 | 12/2002 | Bruce et al. |
| 6,506,692 B2 | 1/2003 | Andideh |
| 6,525,403 B2 | 2/2003 | Inaba et al. |
| 6,534,807 B2 | 3/2003 | Mandelman et al. |
| 6,537,862 B2 | 3/2003 | Song |
| 6,537,885 B1 | 3/2003 | Kang et al. |
| 6,537,901 B2 | 3/2003 | Cha et al. |
| 6,562,665 B1 | 5/2003 | Yu |
| 6,583,469 B1 | 6/2003 | Fried et al. |
| 6,605,498 B1 | 8/2003 | Murthy et al. |
| 6,610,576 B2 | 8/2003 | Nowak |
| 6,611,029 B1 | 8/2003 | Ahmed et al. |
| 6,630,388 B2 | 10/2003 | Sekigawa et al. |
| 6,635,909 B2 | 10/2003 | Clark et al. |
| 6,642,090 B1 | 11/2003 | Fried et al. |
| 6,642,114 B2 | 11/2003 | Nakamura |
| 6,645,797 B1 | 11/2003 | Buynoski et al. |
| 6,645,826 B2 | 11/2003 | Yamazaki et al. |
| 6,656,853 B2 | 12/2003 | Ito |
| 6,657,259 B2 | 12/2003 | Fried et al. |
| 6,664,160 B2 | 12/2003 | Park et al. |
| 6,680,240 B1 | 1/2004 | Maszara |
| 6,689,650 B2 | 2/2004 | Gambino et al. |
| 6,693,324 B2 | 2/2004 | Maegawa et al. |
| 6,696,366 B1 | 2/2004 | Morey et al. |
| 6,706,571 B1 | 3/2004 | Yu et al. |
| 6,709,982 B1 | 3/2004 | Buynoski et al. |
| 6,713,396 B2 | 3/2004 | Anthony |
| 6,716,684 B1 | 4/2004 | Krivokapic et al. |
| 6,716,690 B1 | 4/2004 | Wang et al. |
| 6,730,964 B2 | 5/2004 | Horiuchi |
| 6,744,103 B2 | 6/2004 | Snyder |
| 6,756,657 B1 | 6/2004 | Zhang et al. |
| 6,764,884 B1 | 7/2004 | Yu et al. |
| 6,770,516 B2 | 8/2004 | Wu et al. |
| 6,774,390 B2 | 8/2004 | Sugiyama et al. |
| 6,780,694 B2 | 8/2004 | Doris et al. |
| 6,787,402 B1 | 9/2004 | Yu |
| 6,787,406 B1 | 9/2004 | Hill et al. |
| 6,787,439 B2 | 9/2004 | Ahmed et al. |
| 6,787,845 B2 | 9/2004 | Deleonibus |
| 6,787,854 B1 | 9/2004 | Yang et al. |
| 6,790,733 B1 | 9/2004 | Natzle et al. |
| 6,794,313 B1 | 9/2004 | Chang |
| 6,794,718 B2 | 9/2004 | Nowak et al. |
| 6,798,000 B2 | 9/2004 | Luyken et al. |
| 6,800,885 B1 | 10/2004 | An et al. |
| 6,800,910 B2 | 10/2004 | Lin-Ming et al. |
| 6,803,631 B2 | 10/2004 | Dakshina-Murthy et al. |
| 6,812,075 B2 | 11/2004 | Fried et al. |
| 6,812,111 B2 | 11/2004 | Cheong et al. |
| 6,815,277 B2 | 11/2004 | Fried et al. |
| 6,821,834 B2 | 11/2004 | Ando |
| 6,831,310 B1 | 12/2004 | Mathew et al. |
| 6,833,588 B2 | 12/2004 | Yu et al. |
| 6,835,614 B2 * | 12/2004 | Hanafi et al. ............... 438/212 |
| 6,835,618 B1 | 12/2004 | Dakshina-Murthy et al. |
| 6,838,322 B2 | 1/2005 | Pham et al. |
| 6,844,238 B2 | 1/2005 | Yeo et al. |
| 6,849,884 B2 | 2/2005 | Clark et al. |
| 6,852,559 B2 | 2/2005 | Kwak et al. |
| 6,855,606 B2 | 2/2005 | Chen et al. |
| 6,855,990 B2 | 2/2005 | Yeo et al. |
| 6,858,478 B2 | 2/2005 | Chau et al. |
| 6,867,433 B2 | 3/2005 | Yeo et al. |
| 6,867,460 B1 | 3/2005 | Anderson et al. |
| 6,869,868 B2 | 3/2005 | Chiu et al. |
| 6,884,154 B2 | 4/2005 | Mizushima et al. |
| 6,885,055 B2 | 4/2005 | Lee |
| 6,890,811 B2 | 5/2005 | Hou et al. |
| 6,897,527 B2 | 5/2005 | Dakshina-Murthy et al. |
| 6,902,947 B2 | 6/2005 | Chinn et al. |
| 6,909,147 B2 | 6/2005 | Aller et al. |
| 6,919,238 B2 | 7/2005 | Bohr |
| 6,921,691 B1 | 7/2005 | Li et al. |
| 6,921,702 B2 | 7/2005 | Ahn et al. |
| 6,921,963 B2 | 7/2005 | Krivokapic et al. |
| 6,921,982 B2 | 7/2005 | Joshi et al. |
| 6,924,190 B2 | 8/2005 | Dennison |
| 6,960,517 B2 | 11/2005 | Rios et al. |
| 6,967,351 B2 | 11/2005 | Fried et al. |
| 6,969,878 B2 | 11/2005 | Coronel et al. |
| 6,970,373 B2 | 11/2005 | Datta et al. |
| 6,974,738 B2 | 12/2005 | Hareland et al. |
| 7,018,551 B2 | 3/2006 | Beintner et al. |
| 7,045,401 B2 | 5/2006 | Lee et al. |
| 7,060,539 B2 | 6/2006 | Chidambarrao et al. |
| 7,061,055 B2 | 6/2006 | Sekigawa et al. |
| 7,071,064 B2 | 7/2006 | Doyle et al. |
| 7,074,623 B2 | 7/2006 | Lochtefeld et al. |
| 7,074,656 B2 | 7/2006 | Yeo et al. |
| 7,074,662 B2 | 7/2006 | Lee et al. |
| 7,105,390 B2 * | 9/2006 | Brask et al. ............... 438/149 |
| 7,105,891 B2 | 9/2006 | Visokay et al. |

| | | |
|---|---|---|
| 7,112,478 B2 | 9/2006 | Grupp et al. |
| 7,122,463 B2 | 10/2006 | Ohuchi |
| 7,132,360 B2 | 11/2006 | Schaeffer et al. |
| 7,138,320 B2 | 11/2006 | Bentum et al. |
| 7,141,480 B2 | 11/2006 | Adam et al. |
| 7,141,856 B2 | 11/2006 | Lee et al. |
| 7,154,118 B2 | 12/2006 | Lindert |
| 7,163,851 B2 | 1/2007 | Adadeer et al. |
| 7,172,943 B2 | 2/2007 | Yeo et al. |
| 7,183,137 B2 | 2/2007 | Lee et al. |
| 7,187,043 B2 | 3/2007 | Arai et al. |
| 7,238,564 B2 | 7/2007 | Ko et al. |
| 7,241,653 B2 | 7/2007 | Hareland et al. |
| 7,247,578 B2 | 7/2007 | Brask |
| 7,250,367 B2 | 7/2007 | Vaartstra et al. |
| 7,250,645 B1 | 7/2007 | Wang et al. |
| 7,268,024 B2 | 9/2007 | Yeo et al. |
| 7,291,886 B2 | 11/2007 | Doris et al. |
| 7,297,600 B2 | 11/2007 | Oh et al. |
| 7,304,336 B2 | 12/2007 | Cheng et al. |
| 7,323,710 B2 | 1/2008 | Kim et al. |
| 7,329,913 B2 | 2/2008 | Brask et al. |
| 2002/0011612 A1 | 1/2002 | Hieda |
| 2002/0166838 A1 | 11/2002 | Nagarajan |
| 2003/0067017 A1 | 4/2003 | Ieong et al. |
| 2003/0085194 A1 | 5/2003 | Hopkins, Jr. |
| 2003/0098488 A1 | 5/2003 | O'Keeffe et al. |
| 2003/0151077 A1 | 8/2003 | Mathew et al. |
| 2004/0029345 A1* | 2/2004 | Deleonibus et al. ......... 438/257 |
| 2004/0036126 A1 | 2/2004 | Chau et al. |
| 2004/0063286 A1* | 4/2004 | Kim et al. .................. 438/283 |
| 2004/0094807 A1 | 5/2004 | Chau et al. |
| 2004/0121531 A1* | 6/2004 | Wieczorek et al. .......... 438/197 |
| 2004/0126975 A1 | 7/2004 | Ahmed et al. |
| 2004/0191980 A1 | 9/2004 | Rios et al. |
| 2004/0195624 A1 | 10/2004 | Liu et al. |
| 2004/0203254 A1 | 10/2004 | Conley et al. |
| 2004/0238887 A1 | 12/2004 | Nihey |
| 2004/0262683 A1 | 12/2004 | Bohr et al. |
| 2005/0093154 A1 | 5/2005 | Kottantharayil et al. |
| 2005/0104055 A1 | 5/2005 | Kwak et al. |
| 2005/0127362 A1 | 6/2005 | Zhang et al. |
| 2005/0139860 A1 | 6/2005 | Snyder et al. |
| 2005/0145941 A1 | 7/2005 | Bedell et al. |
| 2005/0156202 A1 | 7/2005 | Rhee et al. |
| 2005/0156227 A1 | 7/2005 | Jeng |
| 2005/0167766 A1 | 8/2005 | Yagishita |
| 2005/0224797 A1 | 10/2005 | Ko et al. |
| 2005/0227498 A1 | 10/2005 | Furukawa et al. |
| 2005/0230763 A1 | 10/2005 | Huang et al. |
| 2005/0233156 A1 | 10/2005 | Senzaki et al. |
| 2006/0014338 A1 | 1/2006 | Doris et al. |
| 2006/0040054 A1 | 2/2006 | Pearlstein et al. |
| 2006/0086977 A1 | 4/2006 | Shah et al. |
| 2006/0154478 A1 | 7/2006 | Hsu et al. |
| 2006/0172479 A1* | 8/2006 | Furukawa et al. .......... 438/197 |
| 2006/0211184 A1 | 9/2006 | Boyd et al. |
| 2006/0286755 A1* | 12/2006 | Brask et al. ................. 438/299 |
| 2007/0093010 A1 | 4/2007 | Mathew et al. |
| 2007/0108514 A1 | 5/2007 | Inoue et al. |

FOREIGN PATENT DOCUMENTS

| | | |
|---|---|---|
| EP | 0 623963 A1 | 11/1994 |
| EP | 1 202 335 A2 | 5/2002 |
| EP | 1 566 844 A2 | 8/2005 |
| GB | 2 156 149 | 10/1985 |
| JP | 59 145538 A | 8/1984 |
| JP | 02-303048 A | 12/1990 |
| JP | 06177089 | 6/1994 |
| JP | 2003-298051 | 10/2003 |
| WO | WO 02/43151 A1 | 5/2002 |
| WO | WO 2004/059726 A1 | 7/2004 |

OTHER PUBLICATIONS

Yang-Kyu Choi, et al., "A Spacer Patterning Technology for Nanoscale CMOS" IEEE Transactions on Electron Devices, vol. 49, No. 3, Mar. 2002, pp. 436-441.

W. Xiong, et al., "Corner Effect in Multiple-Gate SOI MOSFETs" 2003 IEEE, pp. 111-113.

Weize Xiong, et al., "Improvement of FinFET Electrical Characteristics by Hydrogen Annealing" IEEE Electron Device Letters, vol. 25, No. 8, Aug. 2004, XP-001198998, pp. 541-543.

Fu-Liang Yang, et al., "5nm-Gate Nanowire FinFET" 2004 Symposium on VLSI Technology Digest of Technical Papers, 2004 IEEE, pp. 196-197.

Jing Guo et al. "Performance Projections for Ballistic Carbon Nanotube Field-Effect Transistors" Applied Physics Letters, vol. 80, No. 17, Apr. 29, 2002, pp. 3192-2194.

Ali Javey et al., "High-K Dielectrics for Advanced Carbon-Nanotube Transistors and Logic Gates", Advance Online Publication, Published online, Nov. 17, 2002, pp. 1-6.

Richard Martel et al., "Carbon Nanotube Field Effect Transistors for Logic Applications" IBM, T.J. Watson Research Center, 2001 IEEE, IEDM 01, pp. 159-162.

David M. Fried et al., "Improved Independent Gate N-Type FinFET Fabrication and Characterization", IEEE Electron Device Letters, vol. 24, No. 9, Sep. 2003, pp. 592-594.

David M. Fried et al., "Improved Independent Gate P-Type Independent-Gate FinFETs", IEEE Electron Device Letters, vol. 25, No. 4, Apr. 2004, pp. 199-201.

Charles Kuo et al. "A Capacitorless Double Gate DRAM Technology for Sub-100-nm Embedded and Stand-Alone Memory Applications, IEEE Transactions on Electron Devices", vol. 50, No. 12, Dec. 2003, pp. 2408-2416.

Charles Kuo et al., "A Capacitorless Double-Gate DRAM Cell Design for High Density Applications", 2002 IEEE International Electron Devices Meeting Technical Digest, Dec. 2002, pp. 843-846.

Takashi Ohsawa et al., "Memory Design Using a One-Transistor Gain Cell on SOI", IEEE Journal of Solid-State Circuits, vol. 37, No. 11, Nov. 2002, pp. 1510-1522.

T. Tanaka et al., Scalability Study on a Capacitorless 1T-DRAM: From Single-Gate PD-SOI to Double-Gate FinDram, 2004 IEEE International Electron Devices Meeting Technical Digest, Dec. 2004, (4 pgs.).

V. Subramanian et al. "A Bulk Si-Compatible Ultrathin-Body SOI Technology for Sub-100nm MOSFETS", Proceedings of the 57th Annual Device Reach Conference, (1999) pp. 28-29.

Hisamoto et al. "A Folded-Channel MOSFET for Deep-sub-tenth Micron Era", 1998 IEEE International Electron Device Meeting Technical Digest, (1998) pp. 1032-1034.

Huang et al., "Sub 50nm FinFet: PMOS", 1999 IEEE International Electron Device Meeting Technical Digets, (1999) pp. 67-70.

Auth et al., "Vertical, Fully-Depleted, Surroundings Gate MOSFETS on Sub 0.1um Thick Silicon Pillars", 1996 54th Annual Device Reseach Conference Digest, (1996) pp. 108-109.

Hisamoto et al., "A Fully Depleted Lean-Channel Transistor (DELTA)-A Novel Vertical Ultrathin SOI MOSFET", IEEE Electron Device Letters, vol. 11 No. 1, (1990) pp. 36-38.

Jong-Tae Park et al., "Pi-Gate SOI MOSFET" IEEE Electron Device Letters, vol. 22, No. 8, Aug. 2001, pp. 405-406.

Digh Hisamoto et al., "FinFet-A Self Aligned Double-Gate MOSFET Scalable to 20nm", IEEE Transactions on Electron Devices, vol. 47, No. 12, Dec. 2000, pp. 2320-2325.

T. Park et al., "Fabrication of Body-Tied FinFETs (Omega MOSFETs) Using Bulk Si Wafers", 2003 Symposia on VLSI Technology Digest of Technical Papers, Jun. 2003, pp. 135-136.

Burenkov et al., "Corner Effect in Double and Triple Gate FinFets", IEEE 2003, pp. 135-138.

S.T. Chang et al., "3-D Simulation of Strained Si/SiGe Heterojunction FinFETs", pp. 176-177.

Jin et al., "Mobility Enhancement in Compressively Strained SiGe Surface Channel PMOS Transistors with Hf02/TiN Gate Stack", Proceedings of the First Joint International Symposium, 206th Meeting of Electrochemical Society, Oct. 2004, pp. 111-122.

R. Chau, "Advanced Metal Gate/High-K Dielectric Stacks for High-Performance CMOS Transistors", Proceedings of AVS 5th International Conference of Microelectronics and Interfaces, Mar. 2004, (3 pgs.).

T. Ludwig et al., "FinFET Technology for Future Microprocessors" 2003 IEEE, pgs. 33-34.

Peter A. Stolk et al. "Modeling Statistical Dopant Fluctuations in MOS Transistors", 1998 IEEE, IEEE Transactions on Electron Devices, vol. 45, No. 9, Sep. 1998, pp. 1960-1971.

Evert Seevinck et al., "Static-Noise Margin Analysis of MOS SRAM Cells" 1987 IEEE, IEEE Journals of Solid-State Circuits, vol. SC-22, No. 5, Oct. 1987.

Yang-Kyu Choi et al. "Sub-20nm CMOS FinFET Technologies", IEEE 2001, IEDM 01-421 to 01-424.

M. Ieong et al. "Three Dimensional CMOS Devices and Integrated Circuits", IEEE 2003, CICC, San Jose, CA, Sep. 21-24, 2003, pp. 207-214.

E.J. Nowak et al., "Scaling Beyond the 65nm Node with FinFET-DGCMOS", IEEE 2003, CICC, San Jose, CA, Sep. 21-24, 2033, pp. 339-342.

E.C. Jones, "Doping Challenges in Exploratory Devices for High Performance Logic", 14th International Conference, Piscataway, NJ, Sep. 22-27, 2002, pp. 1-6.

T. Park et al. "PMOS Body-Tied FinFET (Omega MOSFET) Characteristics", Device Research Conference, Piscataway, NJ, Jun. 23-25, 2003, IEEE, pp. 33-34.

E.J. Nowak et al., "A Functional FinFET-DGCMOS SRAM Cell", International Electron Devices Meeting 2002, San Francisco, CA, Dec. 8-11, 2002, pp. 411-414.

Jae-Hyoun Park, "Quantum-wired MOSFET Photodetector Fabricated by Conventional Photolithography on SOI Substrate", Nanotechnology, 2004, 4th IEEE Conference on Munich, Germany, Aug. 16-19, 2004, Piscataway, NJ, pp. 425-427, XP010767302.

L. Chang et al. "CMOS Circuit Performance Enhancement by Surface Orientation Optimization"IEEE Transactions on Electron Devices, IEEE Service Center, Piscataway, NJ vol. 51, No. 10, Oct. 2004, pp. 1621-1627 XP001211140.

M. Stadele et al., "A Comprehensive Study of Corner Effects in Tri-gate Transistors", IEEE 2004, pp. 165-168.

Ali Javey et al., "Ballistic Carbon Nanotube Field-Effect Transistors", Nature, vol. 424, Aug. 7, 2003, pp. 654-657.

T. M. Mayer, et al., "Chemical Vapor Deposition of Fluoroalkylsilane Monolayer Films for Adhesion Control in Microelectromechanical Systems" 2000 American Vacuum Society B 18(5), Sep.-Oct. 2000, pp. 2433-2440.

* cited by examiner

FABRICATION OF CHANNEL WRAPAROUND GATE STRUCTURE FOR FIELD-EFFECT TRANSISTOR

FIELD OF THE INVENTION

The invention is in the field of Field-Effect Transistors.

PRIOR ART AND RELATED ART

The continuing trend in the fabrication of complementary metal-oxide-semiconductor (CMOS) transistors is to scale the transistors. Examples of transistors having reduced bodies along with tri-gate structures are shown in U.S. 2004/0036127. Other small transistors are delta-doped transistors formed in lightly doped or undoped epitaxial layers grown on a heavily doped substrate. See, for instance, "Metal Gate Transistor with Epitaxial Source and Drain Regions," application Ser. No. 10/955,669, filed Sep. 29, 2004, assigned to the assignee of the present application.

The ability to continue scaling CMOS transistors to even smaller geometries is hindered by the off-state leakage current. Off-state current reduces the switching efficiency and robs system power. This is particularly significant in planar CMOS transistors, where substrate leakage paths account for most of the current flow in the off state. While three-dimensional structures such as tri-gates and fin-FETs are more scalable, since they have more effective electrostatic control, there still remains a leakage path in the channel.

One structure for providing a more completely wrapped around gate is described in "Nonplanar Semiconductor Device with Partially or Fully Wrapped Around Gate Electrode and Methods of Fabrication," U.S. patent application Ser. No. 10/607,769, filed Jun. 27, 2003.

DETAILED DESCRIPTION

A process for fabricating CMOS field-effect transistors and the resultant transistors are described. In the following description, numerous specific details are set forth, such as specific dimensions and chemical regimes, in order to provide a thorough understanding of the present invention. It will be apparent to one skilled in the art that the present invention may be practiced without these specific details. In other instances, well-known processing steps, such as cleaning steps, are not described in detail, in order to not unnecessarily obscure the present invention. Also, in the description below, the fabrication of a single transistor is described. As will be appreciated in the typical integrated circuit, both n and p channel transistors are fabricated.

Figure 1:
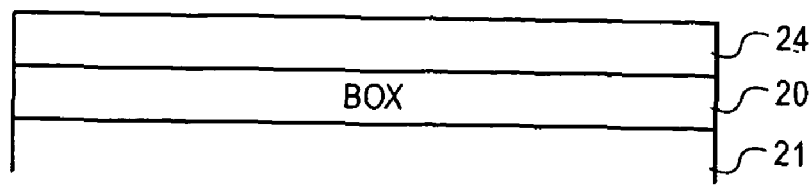
FIG. 1 is a cross-sectional, elevation view of a silicon-on-insulator (SOI) substrate.

In one embodiment, transistors are fabricated on a buried oxide layer (BOX) 20 which is disposed on a silicon substrate 21 shown in FIG. 1. Transistor bodies are fabricated from a monocrystalline, silicon layer 24 disposed on BOX 20. This silicon-on-insulation (SOI) substrate is well-known in the semiconductor industry. By way of example, the SOI substrate is fabricated by bonding the oxide layer 20 and silicon layer 24 onto the substrate 21, and then planarizing the layer 24 until it is relatively thin. Other techniques are known for forming an SOI substrate including, for instance, the implantation of oxygen into a silicon substrate to form a buried oxide layer. Other semiconductor materials, other than silicon, may also be used such as gallium arsenide.

As will be seen, the BOX is seeded through ion implantation beneath the channel region of a transistor to make the oxide more readily etchable than the overlying silicon body. An electrically inactive species is implemented so as to not alter the electrical characteristics of the semiconductor body. Then, after removal of the BOX beneath the channel, a gate insulator and gate are formed entirely around the channel.

Referring to FIG. 1, the layer 24 may be selectively ion implanted with a p type dopant in regions where n channel transistors are to be fabricated, and with an n type dopant in those regions where p channel devices are to be fabricated. This is used to provide the relatively light doping typically found in the channel regions of MOS devices fabricated in a CMOS integrated circuit.

A protective oxide is disposed on the silicon layer 24 followed by the deposition of a silicon nitride layer (both not shown). The nitride layer acts as a hard mask to define silicon bodies such as the silicon body 25 of FIG. 2. By way of example, the body 25 may have a height and width of 20-30 nm.

Figure 2:
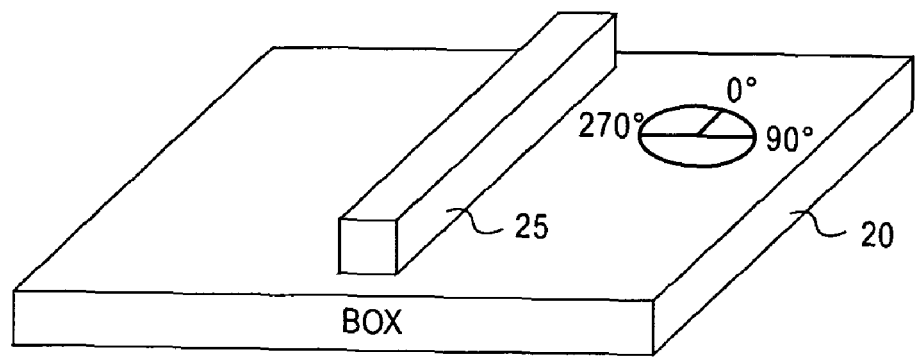
FIG. 2 is a perspective view of the structure of FIG. 1, after the formation of a silicon body, sometimes referred to as a fin.
Figure 3:
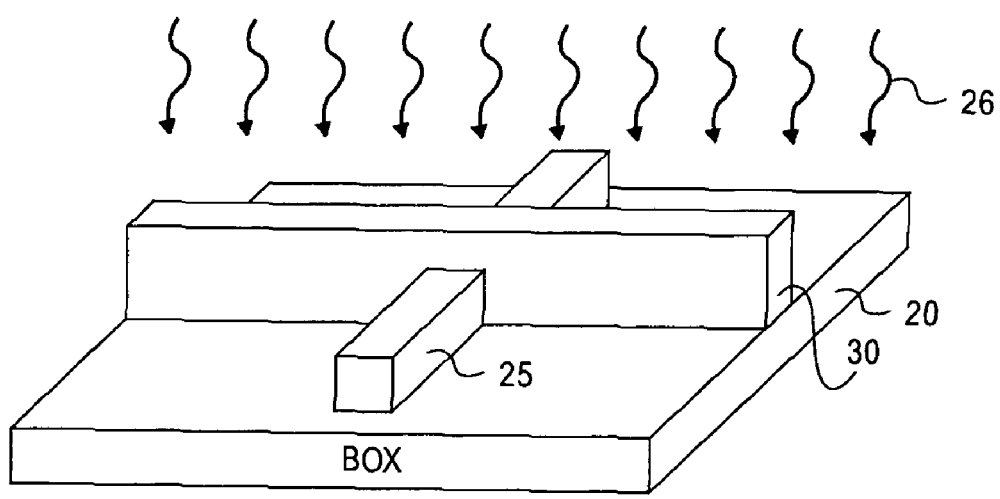
FIG. 3 illustrates the structure of FIG. 2, after a dummy gate is fabricated and during a first ion implantation step.

An oxide (not shown) which subsequently acts as an etchant stop is formed over body 25. A polysilicon layer is formed over the structure of FIG. 2 and etched to define a dummy gate 30 which extends over the body 25 as seen in FIG. 3. The region of the body 25 below the dummy gate 30, as will be seen, is the channel region in this replacement gate process. Once the dummy gate 30 has been defined, phosphorous or arsenic may be implanted into the body 25 for an n channel transistor, or boron for a p channel transistor in alignment with the dummy gate, as illustrated by the ion implantation 26. This ion implantation defines the tip or extension source and drain regions frequently used in CMOS transistors.

Figure 4:
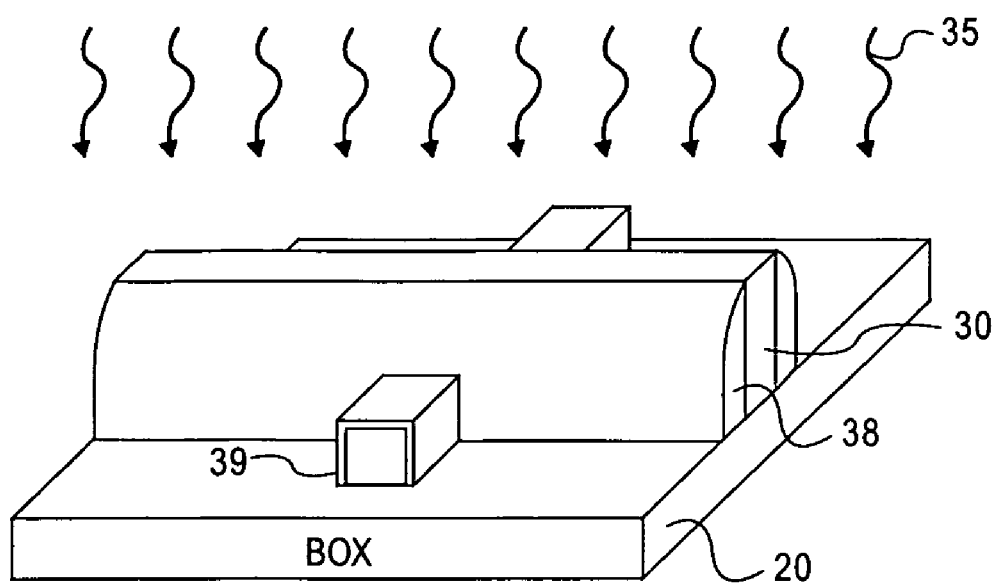
FIG. 4 illustrates the structure of FIG. 3, after spacers are fabricated and during a second ion implantation step.

Now, a layer of silicon nitride is conformally deposited over the structure of FIG. 3 to fabricate the spacers 38 shown in FIG. 4. Ordinary, well-known, anisotropic etching is used to fabricate the spacers. In one embodiment, a carbon-doped nitride, doped with 5-13% carbon concentration is used for the spacers. After the spacer formation, the main part of the source and drain regions are formed through ion implantation 35 shown in FIG. 4. For the n channel transistor, arsenic or phosphorous is used with an implant dose of up to $1\times10^{19}$-$1\times10^{20}$ atoms/cm$^3$. A similar dose range of boron may be used for a p channel transistor.

Following the implantation of the main source and drain region, the silicon body 25, to the extent that it extends beyond the spacers 38, receives a silicide or salicide layer 39 as is often done on exposed silicon in field-effect transistors.

An annealing step to activate the source and drain dopant is used, also commonly used cleaning steps common in the fabrication of a field-effect transistor are not shown.

Figure 5:
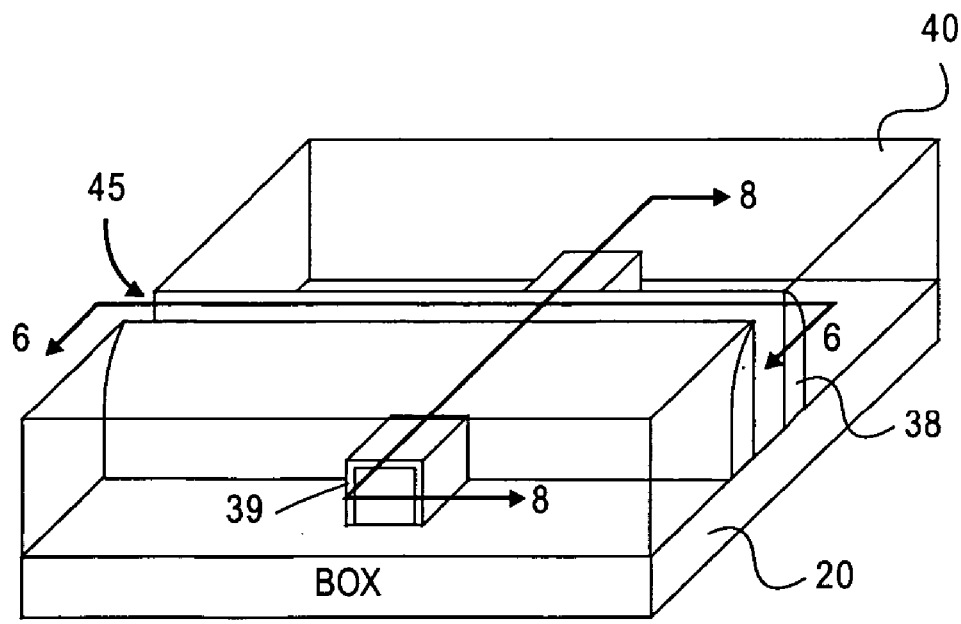
FIG. 5 illustrates the structure of FIG. 4, after forming a dielectric layer and after the removal of the dummy gate.

A dielectric layer 40 is now conformally deposited over the structure of FIG. 4, as shown in FIG. 5. This may comprise a silicon dioxide layer which will become an interlayer dielectric (ILD) in an integrated circuit or a low-k ILD may be used. Alternatively, a sacrificial dielectric layer may be used. In any event, the layer 40 typically has the mechanical strength to withstand a planarization process such as chemical mechanical polishing (CMP) so that it may be polished level with the top of the spacers 38.

After the deposition and planarization of the dielectric layer 40, a wet etch is used to remove the dummy polysilicon gate 30, leaving the opening 45, as shown in FIG. 5. (A dummy gate oxide (not shown) may also be removed.) The cross-sectional view of FIG. 6, taken through section line 6-6 of FIG. 5, also shows the body 25. This view is a better reference for the ion implantation of FIG. 7.

Figure 6:
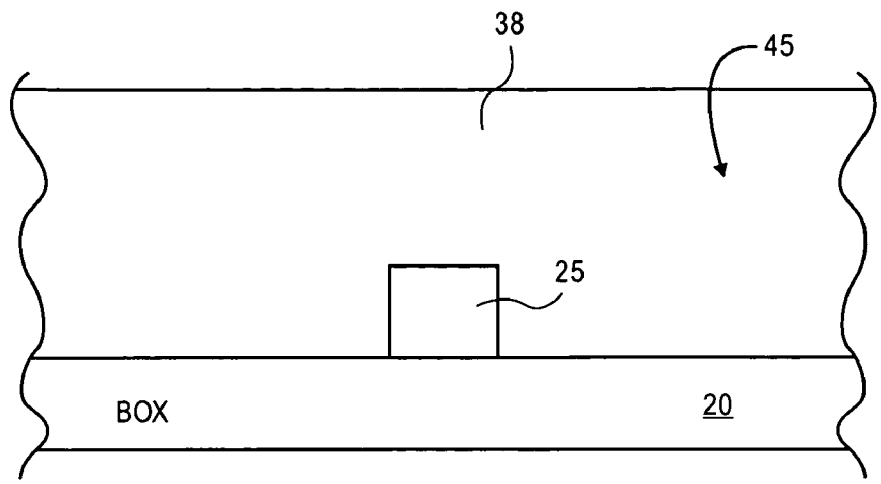
FIG. 6 is a cross-sectional, elevation view of the structure of FIG. 5 through section line 6-6 of FIG. 5.
Figure 7:
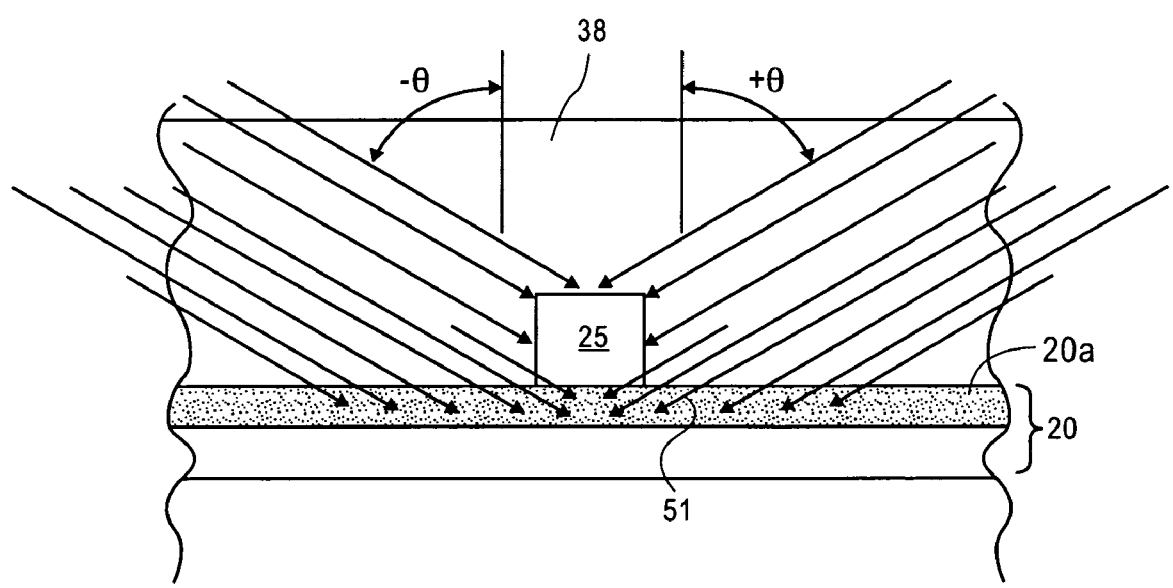
FIG. 7 illustrates the structure of FIG. 6 during an ion implantation step.

Referring to FIG. 7, the wafer having the structure of FIG. 6 is now ion implanted at an angle of θ° relative to the normal of the wafer with the wafer at two different angles of rotation. These angles of rotation are in the plane of the wafer and are referred to below as the wafer rotation angle. The angle between the normal to the wafer and the ion beam is referred to below as the ion implantation angle θ.

First, for instance, the wafer is ion implanted at the angle θ with the wafer rotated to an angle of 90°. Then, implantation occurs again at the angle θ with the wafer rotated to an angle of 270°. The wafer rotation angles of 90° and 270°, shown in FIG. 2 are perpendicular to the body 25. Since 90° and 270° are 180° apart, the net effect is the same as implanting at ±θ, as shown in FIG. 7. The implanted ions are implanted into the dielectric 40, in the exposed portions of the BOX 20, as well as under the channel region of the body 25 and in the channel region of body 25. θ may be in the range of 30°-60°, the angle is selected so as to insure that the ions are implanted into all the BOX 20 under the body 25.

Ions seeded into the upper portion of BOX 20, shown as region 20a, cause BOX 20 to be more readily etched and to provide better selectivity between the region 20a versus the body 25 and the non-implanted regions of BOX 20. The ions alter the crystalline nature of BOX 20, in effect, amorphizing or modifying the structure making it less resistant to selected chemistry without making body 25 or non-implanted regions of the BOX 20 more readily etched. More specifically, by selecting suitable ions and a suitable wet etchant, the implanted region 20a is etched more readily in the presence of the wet etchant compared to the body 25 or unexposed portions of the BOX 20, allowing the implanted portion of the BOX 20 (region 20a), including beneath the body 25 to be removed without substantially affecting the dimensions of the body 25. A discussion of pre-etch implantation may be found in U.S. 2004/0118805. Wet etchant discrimination ratio of 6-1 between implanted silicon dioxide and non-implanted silicon dioxide are achievable.

Ions selected for the implantation shown in FIG. 7 are electrically inactive in the BOX 20 and the semiconductor body 25. For example, silicon can be implanted where the body 25 is a silicon body, to disrupt the structure of the silicon dioxide without altering the electrical properties of the body 25. In subsequent annealing, the additional silicon ions implanted in body 25 are re-crystallized and have substantially no impact on the transistor characteristics. Further, electrically inactive species such as nitrogen or halogens (fluorine, chlorine, etc.) may be implanted to create structural alteration with the resultant modification of the wet etch rate without adversely effecting the electrical behavior of the transistor. These species remain in the silicon without altering the electrical characteristics of the transistor which is subsequently formed.

Relatively low implantation energies and dose levels are adequate to sufficiently seed the BOX 20 beneath the body 25 to allow removal of the oxide below the body. For example, energy levels for implanting silicon in the range of 0.5-2.0 KeV, to a dose of $1 \times 10^{18}$ atoms/cm$^2$ are sufficient for a silicon body having dimensions of approximately 20×20 nm.

Following the implantation, a wet etch is used to remove the region 20a including the region 20a under the body 25. Many wet chemical etchants are known to be effective and controllable on such thin film materials. As would be apparent to one skilled in the art, they may be appropriately matched with substrate and thin film materials, such as those above, to provide desirable selective etching. Suitable etchants include but are not limited to phosphoric acid ($H_3PO_4$), hydrofluoric acid (HF), buffered HF, hydrochloric acid (HCl), nitric acid ($HNO_3$), acetic acid ($CH_3COOH$), ammonium hydroxide ($NH_4OH$), alcohols, potassium permanganate ($KMnO_4$), ammonium fluoride ($NH_4F$), and others, as would be listed in known wet chemical etching references such as *Thin Film Processes*, Academic Press (1978), edited by John L. Vossen and Werner Kern. Mixtures of these and other etchant chemicals are also conventionally used.

Figure 8:
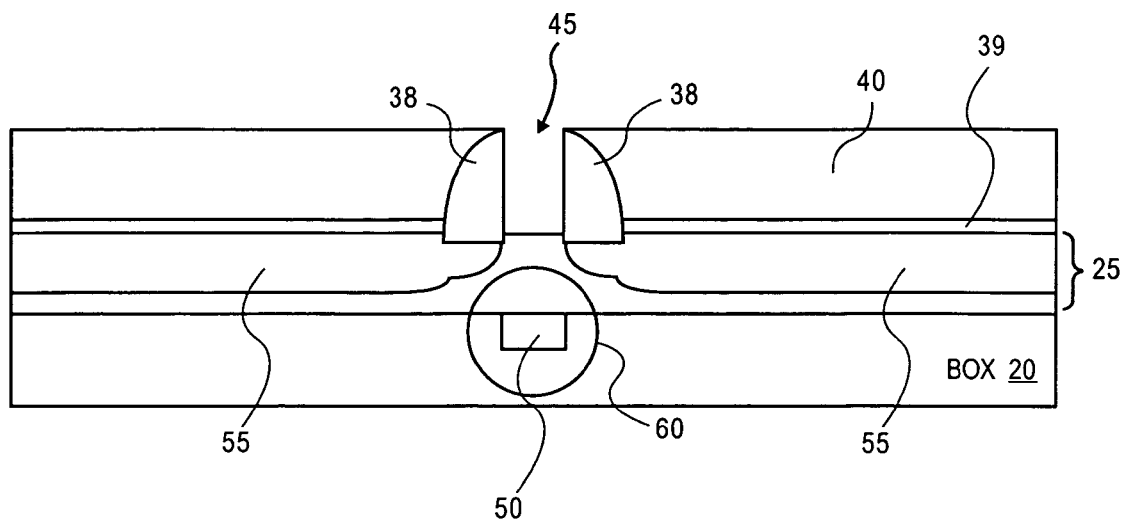
FIG. 8 illustrates the structure of FIG. 7 after an etching step which removes the BOX under the channel region. This view is generally through section line 8-8 of FIG. 5.

The wet etchant of the region 20a of layer 20 defines a trench aligned with the opening 45 which extends beneath the body 25. This trench is best seen in FIG. 8 as trench 50. Note, this view is taken through the section lines 8-8 of FIG. 5. In this view the source and drain regions 55 are visible. The trench 50 is encircled with the circle 60, and enlarged in FIG. 9, as will be subsequently discussed.

A gate dielectric 62 may now be formed on exposed surfaces which includes the sides, top and bottom of the body 25. The gate dielectric has a high dielectric constant (k), such as a metal oxide dielectric, for instance, $HfO_2$ or $ZrO_2$ or other high k dielectrics, such as PZT or BST. The gate dielectric may be formed by any well-known technique such as atomic layer deposition (ALD) or chemical vapor deposition (CVD). Alternately, the gate dielectric may be a grown dielectric. For instance, the gate dielectric 62, may be a silicon dioxide film grown with a wet or dry oxidation process to a thickness between 5-50 Å.

Following this a gate electrode (metal) layer 63 is formed over the gate dielectric layer 62. The gate electrode layer 62 may be formed by blanket deposition of a suitable gate electrode material. In one embodiment, a gate electrode material comprises a metal film such as tungsten, tantalum, titanium and/or nitrides and alloys thereof. For the n channel transistors, a work function in the range of 3.9 to 4.6 eV may be used. For the p channel transistors, a work function of 4.6 to 5.2 eV may be used. Accordingly, for substrates with both n channel and p channel transistors, two separate metal deposition processes may need to be used. Only approximately 100 Å of the metal needs to be formed through ALD to set the work function. The remainder of the gate may be formed of polysilicon.

Figure 10:
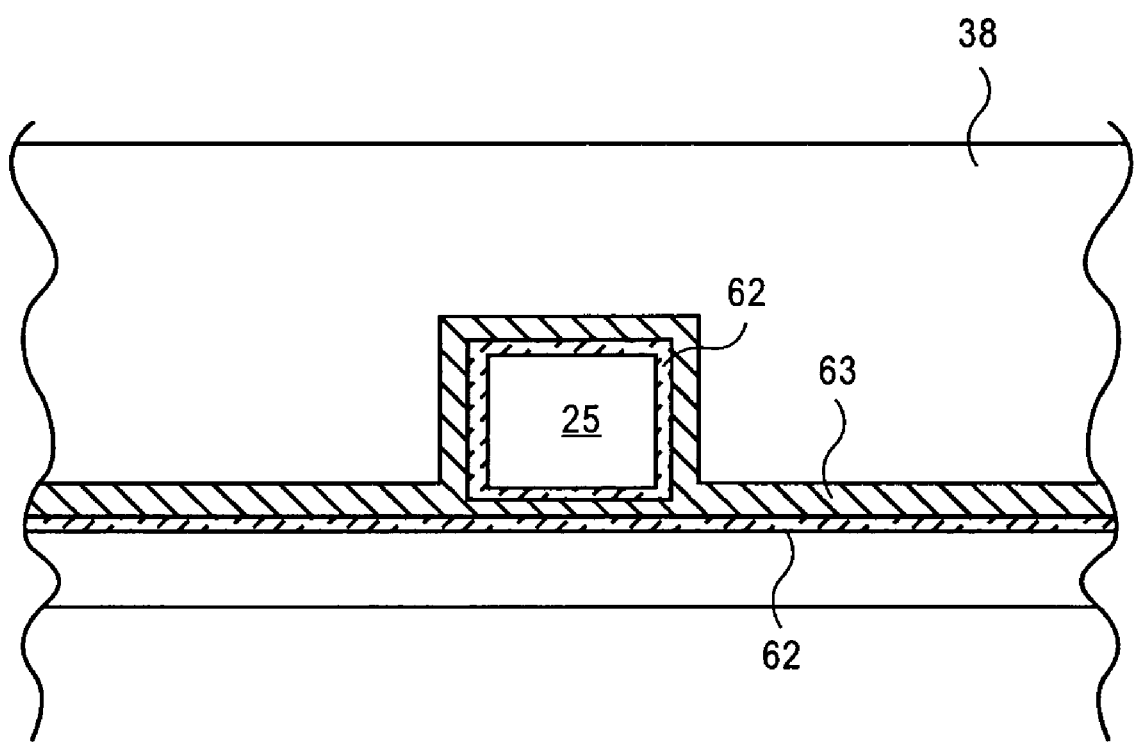
FIG. 10 is a cross-sectional, elevation view taken through the same plane as FIG. 6, this view illustrates the formation of the gate encircling the entire channel region of a semiconductor body.

Standard processing is now used to complete the transistor of FIG. 10.

Figure 9:
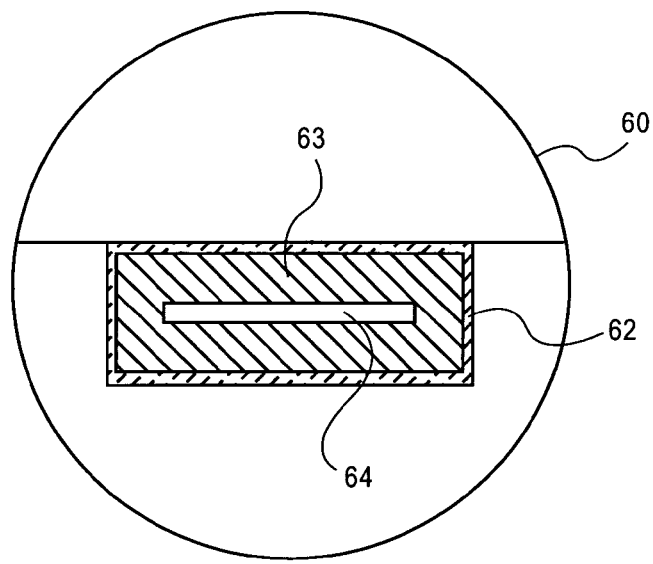
FIG. 9 is an enlarged view of the region beneath the gate after the formation of a gate dielectric layer and a gate metal.

The formation of the gate beneath the body 25 may not be as well defined as the gate on the sides and top of the body 25. For instance, as shown in FIG. 9, a void 64 may occur. Such a void, however, will not affect the performance of the transistor. Moreover, some of the BOX 20 (not shown) may remain directly under the body 25 in the trench 50. This oxide, which is subsequently covered with both the high-k dielectric 62 and the metal 63, will not meaningfully impact transistor performance.

The above described method may also be used on other three dimensional (3D) semiconductor bodies such as semiconducting carbon nanotubes, Group 3-5 nanowires and silicon nanowires. The surface upon which the 3D semiconductor nanostructure rests is ion implanted to alter its etching rate to make it more etchable than the nanostructure.

Thus, a method has been described for forming a gate entirely around a silicon body in a replacement gate process. Ion implantation damages the insulation beneath the semiconductor body in the channel region allowing it to be more readily etched. ALD is then used to form a dielectric and gate entirely around the semiconductor body for one embodiment.

What is claimed is:

1. A method for fabricating a transistor comprising:
   forming a dummy gate over a semiconductor body where the body is disposed on a first dielectric layer;
   forming source and drain regions in the body thereby defining a channel region in the body between the source and drain regions;
   forming a second dielectric layer over the first dielectric layer;
   removing the dummy gate;
   seeding the first dielectric layer under the channel region with ions which enhance the etching of the first dielectric layer;
   subsequently etching the first dielectric layer to define an opening under the channel region in the first dielectric layer; and
   forming a gate insulation and a conductive gate surrounding the channel region.

2. The method defined by claim 1, wherein the seeding of the first dielectric layer comprises implanting ions at angle of ±θ angle with respect to normal from a wafer on which the fabrication is occurring.

3. The method defined by claim 2, wherein one of the angles θ is obtained by rotating the wafer by 180°.

4. The method defined by claim 3, wherein the ions are electrically inactive with respect to the operation of the transistor.

5. The method defined by claim 4, including annealing the transistor after the seeding of the first dielectric layer.

6. The method defined by claim 5, including forming a high-k dielectric layer on the channel regions of the body following the etching of the first dielectric layer.

7. The method defined by claim 1, wherein atomic layer deposition is used for forming the gate insulation and conductive gate.

8. The method defined by claim 7, wherein the gate has a work function between 3.9 to 5.2 eV.

9. The method defined by claim 8, including:
   using a first ion implantation of electrically active ions in alignment with a dummy gate to form a tip source and a tip drain region;
   forming spacers on sides of the dummy gate;
   using a second ion implantation of electrically active ions in alignment with the spacers to form a main source region and a main drain region.

10. A method comprising:
    using a replacement gate process to expose a channel region of a transistor body disposed on a dielectric layer;
    implanting ions which enhance the etching of the dielectric layer into the dielectric layer underlying the channel region;
    subsequent to the implanting ions, etching the dielectric layer; and
    forming a gate insulation and gate substantially surrounding the channel region including underlying the channel region.

11. The method defined by claim 10, wherein the ions are implanted at the angles of ±θ.

12. The method defined by claim 11, wherein the ions are electrically inert with respect to the operation of the transistor.

13. The method defined by claim 10, wherein the metal gate has a work function of between 3.9 to 5.2 eV.

14. The method defined by claim 10, wherein the replacement gate process includes a polysilicon dummy gate which is removed to expose the channel region.

15. The method defined by claim 14, wherein the ions are implanted at the angles of ±θ.

16. The method defined by claim 10, including the annealing of the transistor following the implanting of the ions used to enhance the etching.

17. The method defined by claim 10, wherein the dielectric layer comprises a buried oxide of a silicon-oxide-insulative substrate.

18. The method defined by claim 10, wherein the implanted ions are electrically inert.

19. The method defined by claim 18, wherein the ions are silicon.

20. The method defined by claim 19, wherein the work function of the gate is between 3.9 to 5.2 eV.

\* \* \* \* \*

UNITED STATES PATENT AND TRADEMARK OFFICE
CERTIFICATE OF CORRECTION

PATENT NO. : 7,915,167 B2  
APPLICATION NO. : 11/240440  
DATED : March 29, 2011  
INVENTOR(S) : Marko Radosavljevic et al.

Page 1 of 1

It is certified that error appears in the above-identified patent and that said Letters Patent is hereby corrected as shown below:

Column 5, lines 40-41 Claim 3, should read

3. The method defined by claim 2, wherein one of the angles θ is obtained by rotating the wafer by 180°.

Signed and Sealed this  
Twenty-eighth Day of June, 2011

David J. Kappos  
*Director of the United States Patent and Trademark Office*